United States Patent [19]

Poulin et al.

[11] Patent Number: 4,606,999
[45] Date of Patent: Aug. 19, 1986

[54] DEVELOPMENT OF POSITIVE PHOTORESISTS USING CYCLIC QUATERNARY AMMONIUM HYDROXIDES

[75] Inventors: Susan B. Poulin, Woburn; Ann B. Salamone, Marble Head, both of Mass.

[73] Assignee: Thiokol Corporation, Chicago, Ill.

[21] Appl. No.: 786,998

[22] Filed: Nov. 12, 1985

Related U.S. Application Data

[62] Division of Ser. No. 564,971, Dec. 21, 1983, Pat. No. 4,556,629.

[51] Int. Cl.$^4$ ................................................. G03F 7/26
[52] U.S. Cl. ..................................... 430/326; 430/331; 430/309; 430/189; 430/192
[58] Field of Search ............... 430/326, 309, 302, 331, 430/189, 192; 252/541, 547, 548, 542

[56] References Cited

U.S. PATENT DOCUMENTS

| | | | |
|---|---|---|---|
| 3,887,450 | 6/1975 | Gilano et al. | 430/910 |
| 4,239,661 | 12/1980 | Muraoka et al. | 252/541 |
| 4,384,037 | 5/1983 | Hosaka et al. | 430/331 |
| 4,411,981 | 10/1983 | Minezaki | 430/326 |
| 4,423,138 | 12/1983 | Guild | 252/548 |
| 4,464,461 | 8/1984 | Guild | 430/326 |

FOREIGN PATENT DOCUMENTS

| | | | |
|---|---|---|---|
| 62733 | 10/1982 | European Pat. Off. | 430/331 |
| 51-56226 | 5/1976 | Japan | 430/331 |
| 1367830 | 9/1974 | United Kingdom | 430/331 |

OTHER PUBLICATIONS

Guild, *Research Disclosure*, No. 186, 10/1979, pp. 575–576.
DiFazio, *IBM Tech. Discl. Bulletin*, vol. 16, No. 2, 7/1973, p. 486.

*Primary Examiner*—Charles L. Bowers, Jr.
*Attorney, Agent, or Firm*—Gerald K. White

[57] ABSTRACT

A method of developing a positive photoresist layer which has been image-wise-exposed comprising contacting the layer with an alkaline developing composition to remove exposed areas of the layer, the developing composition comprising a solution containing a cyclic quaternary ammonium hydroxide developing agent in a sufficient concentration to remove exposed areas of the layer. The present invention also includes a developing composition for use in the method.

9 Claims, No Drawings

DEVELOPMENT OF POSITIVE PHOTORESISTS USING CYCLIC QUATERNARY AMMONIUM HYDROXIDES

This application is a division of application Ser. No. 564,971, filed Dec. 21, 1983, now U.S. Pat. No. 4,556,629.

BACKGROUND OF THE INVENTION

1. Field of the Invention

The present invention relates to developers for positive photoresists.

2. Description of the Prior Art

Various compounds are disclosed in the prior art as being suitable for use as developers for positive photoresists. Exposure of a positive photoresist to actinic radiation results in a solubility differential between the exposed and unexposed areas such that treatment with an appropriate developer results in removal of the radiation-struck areas and retention of the desired image areas on the support. The criteria for a suitable photoresist developer are speed of development, high selectivity between exposed and unexposed areas, high basicity, and solubility of exposed resin for removal from the film surface.

A typical listing of suitable bases for use as developers appears in U.S. Pat. No. 3,887,450. Included are various primary, secondary, tertiary amines and hydroxyamines; cyclic amines; polyamines; water soluble basic salts of the above; and ammonium hydroxide and tetrasubstituted ammonium hydroxides. In spite of these extensive lists, the most commonly used developers for positive acting photoresists are alkylammonium hydroxides, such as tetramethyl ammonium hydroxide.

U.S. Pat. No. 4,294,911 describes a developing composition comprising a quaternary alkanol ammonium hydroxide developing agent and a stabilizing concentration of a sulfite. The developing composition is stated to be useful for developing light-sensitive compositions containing a quinone diazide. In the preferred embodiment, the quaternary alkanol ammonium hydroxide is methyl triethanol ammonium hydroxide. Such compounds are known in the prior art, but have suffered from the disadvantage of limited shelf-life. Thus, the '911 patent discloses the use of sulfite as a stabilizer.

However, such compositions continue to suffer from several disadvantages. Although the structure provides certain surfactant-like properties, the concomitant foaming would be a disadvantage during processing. Moreover, the relatively higher molecular weight than the simple quaternary ammonium compounds of the prior art, e.g., tetramethyl ammonium hydroxide, tends to increase the development time.

Because of these and other disadvantages, commercially, the simple quaternary ammonium compounds have continued to be the preferred developing agents. These simple quaternary ammonium developers however, do not exhibit the degree of differential solubilization for exposed and unexposed photoresist that is required to achieve the fine line definition required for advanced microcircuits.

Accordingly, a need exists for compounds which exhibit greater differential solubilization properties towards resins currently used in preparing positive-acting photoresists, and which are more strongly basic and thus better developing agents than the compounds currently used.

SUMMARY OF THE INVENTION

The present invention is a method of developing a positive photoresist layer which has been image-wise-exposed. The method comprises contacting the layer with an alkaline developing composition to remove exposed areas of the layer, the developing composition comprising a solution containing a cyclic quaternary ammonium hydroxide developing agent in a sufficient concentration to remove exposed areas of the layer.

The present invention also includes a positive photoresist composition which comprises a solution of a cyclic quaternary ammonium hydroxide developing agent, the solution having a normality between about 0.1N and about 6.0N.

DETAILED DESCRIPTION OF THE INVENTION

The method of the present invention uses a developing agent which is a cyclic quaternary ammonium hydroxide. By "cyclic quaternary ammonium hydroxide" is meant a compound in which a quaternary substituted nitrogen is a member of an aromatic or nonaromatic ring of between 4 and 8 atoms, the counterion being hydroxide ion. The quaternary nitrogen containing ring optionally includes additional heteroatoms such as sulfur, oxygen, or nitrogen. The quaternary nitrogen containing ring may also be one ring of a bicyclic or tricyclic compound. The quaternary nitrogen atom is substituted by one or two groups depending on whether the ring is aromatic or nonaromatic. Where two groups are present, they may be the same or different. The quaternary nitrogen substitution is preferably an alkyl group or groups of one to four carbon atoms, and more preferably methyl. The remaining members of the quaternary nitrogen ring may also be substituted, if desired.

It is preferred that the quaternary nitrogen be a member of an aromatic ring, and more preferably a pyridinium ring. A preferred pyridinium compound is N-methyl pyridinium hydroxide, particularly when the positive photoresist layer has been prepared from a novalac resin.

While not wishing to be bound by theory, it is believed that the developing composition of the present invention obtains its superior developing properties from the similarity between the structure of the monomer units used in preparing the photoresist, and the structure of developing agent. Thus, photoresists made from novalac resins, i.e., resins which include a phenyl ring, are readily developed by the preferred developing agent, N-methyl pyridinium hydroxide. The similarity of structure is believed to contribute to the solubility of the resin in the developing composition. Moreover, it is believed that the planar structure of the cyclic compounds and that either two or three of the bonds of the quaternary nitrogen are sterically restricted by the ring structure and held back from the hydroxide ion, contribute to produce compounds having considerably less steric hindrance to attack on the exposed resin than the quaternary ammonium compounds of the prior art.

It is preferred that the cyclic quaternary ammonium hydroxide used in the method of the present invention be matched as nearly as possible to the resin of the photoresist in the sense discussed above, i.e., using a pyridine derivative when a novalac resin is being employed. Accordingly, derivatives of the nitrogen heterocyclic compounds in Table I may be used in the practice of the present invention.

TABLE I

| | |
|---|---|
| Pyridine | Purine |
| Pyrrole | Carbazole |
| Isopyrroles | Diazepine |
| Pyrazole | Azepine |
| Triazole | Indole |
| Oxazole | Indolemine |
| Isoxazole | Isobenzazole |
| Thiazole | Pyrindine |
| Isothiazoles | Pyranol-pyrrole |
| Oxadiazoles | Isoindazole |
| Dioxazole | Indoxazine |
| Pyridazine | Benzoxazole |
| Pyrimidine | Anthranil |
| Pyrazine | Quinoline |
| Piperazine | Isoquinoline |
| Triazine | Cinnoline |
| Oxazine | Quinazoline |
| Isoxazine | Naphthridine |
| Oxathiazine | Pyrido-pyridine |
| Oxadiazine | Benzoxazine |
| Morpholine | Benzisoxazine |
| Acridine | Imidazoline |
| Oxatriazoles | Pyrrolidone |

The compounds in Table I are readily quaternized by methods well known in the art. For example, the N-methyl derivative may be made by reaction with methyl chloride, followed by ion exchange to convert the chloride to the hydroxide. Examples of compounds which can be produced in this manner include:

N,N-dimethyl-N'-methyl pyrazinium hydroxide
N,N-dimethyl morpholinium hydroxide
N-methyl-N'-methyl imidazolinium hydroxide
N,N-dimethyl imidazolinium hydroxide Aqueous solutions of the developing agents are preferred in the practice of the method of the present invention. However, both protic and non-protic polar organic solvents may also be used including alcohols, ketones, and solvents such as dimethylformamide.

The developers of the present invention may be advantageously employed to develop novolac-type positive photoresists. Such photoresists are well known to those skilled in the art, and are typified by a photoresist sold by Dynachem Corporation (a subsidiary of Morton Thiokol Inc.) under the trademark OFPR-800, or that sold by Phillip A. Hunt Chemical Co. under the trademark HUNT WAYCOAT 204.

In the developing compositions of this invention, the cyclic quaternary ammonium hydroxide compound can be employed in any concentration sufficient to act as a developing agent. Preferably, the developing composition employed as a working solution is an aqueous solution of the cyclic quaternary ammonium hydroxide having a normality between about 0.1N and about 6.0N, and more preferably between about 0.2N and about 0.5N. The optimum concentration of cyclic quaternary ammonium hydroxide is dependent upon a number of factors, such as the particular compound utilized, the particular light-sensitive material to which the developing composition is applied, and the desired development time. Typically, the developing compositions are prepared in the form of aqueous concentrates, having a much higher concentration of cyclic quaternary ammonium hydroxide than is desired in the working solution and then are diluted with water.

The present invention also includes a positive photoresist developing composition which is described above for use in the method of the present invention. The developing composition comprises a solution of a cyclic quaternary ammonium hydroxide developing agent, the solution having a normality between about 0.1N and about 6.0N.

Photoresist developers employed in the semiconductor industry must be essentially free of metal ion contaminants, such as sodium or potassium ions, which can deteriorate the substrate conductivity and adversely affect important properties of the integrated circuit device such as electrical resistivity. Thus, in a preferred embodiment of the present invention, the developing composition is free, or at least substantially free, of metal ions.

The compositions for use in the present invention can also contain a surfactant. Suitable surfactants for such use are well known to those skilled in the art.

In order to further illustrate the present invention and the advantages thereof, the following specific examples are given, it being understood that these examples are intended only to be illustrative without serving as a limitation on the scope of the present invention.

EXAMPLE 1

Example 1 illustrates the synthesis of N-methyl pyridinium hydroxide, a developing agent for use in the present invention.

Into a 500 ml three neck round bottom flask fitted with heating mantel, magnetic stirrer, thermometer, gas dispersion tube, and condenser, is added 200 ml of pyridine (99+% ultrapure, Alfa Products). The pyridine is heated to 32° C. and then methyl chloride (CH$_3$Cl) is slowly bubbled in. Within 30 minutes (T=41° C.) the solution becomes cloudy. Methyl chloride addition is continued with stirring for 4 hours and the temperature maintained at 50° C. Total CH$_3$Cl addition is 51.5 g. After cooling, the solution is filtered and the white crystalline N-methyl pyridinium chloride is recovered and vacuum dried at 60° C. overnight. The yield is 26.65 g. After standing for several days, more product precipitates out of the filtrate. The mixture is filtered again and the white crystalline product vacuum dried at 60° C. overnight. The additional yield is 10.72 g.

N-methyl pyridinium chloride (17.8 g) is dissolved in 28.2 g of deionized distilled water, diluted to 65 ml, and passed through an ion exchange column containing 340 g of resin sold by Rohm & Haas Co. under the trademark NUCLEAR GRADE AMBERLITE IRN-78, HYDROXIDE FORM. The resulting aqueous solution of N-methyl pyridinium hydroxide is subsequently diluted with deionized distilled water to a concentration of 3.85 wt.% (0.35N).

EXAMPLE 2 AND COMPARATIVE EXAMPLES A-G

To test the developing agent prepared in Example 1, a variety of similar compounds and developing agents of the prior art are compared with N-methyl pyridinium hydroxide. The compounds are as follows:

| Example(s) | Developing Agent |
|---|---|
| 2 | N—methyl pyridinium hydroxide |
| A,E | methyl trihydroxyethylammonium hydroxide |
| B,F | beta-hydroxyethyltrimethylammonium hydroxide |
| C,G | tetrahydroxyethylammonium hydroxide |
| D | tetramethylammonium hydroxide |

Each of the developing agents is added to deionized water to prepare an approximately 0.36N solution, this normality being chosen for comparison against the developing agent of Example D which is commercially available from Philip A. Hunt Chemical Co. under the trademark HUNT-WAYCOAT WX-108-4, itself a 0.36N solution.

The normality of the resulting solutions and the basicity ($pK_b$) are as follows:

| Example(s) | Concentration wt. % | N | $pK_b$ |
|---|---|---|---|
| 2 | 3.85 | 0.35 | 1.29 |
| A,E | 6.18 | 0.34 | 2.83 |
| B,F | 4.13 | 0.349 | 1.91 |
| C,G | 7.58 | 0.359 | 1.54 |
| D | 3.27 | 0.36 | 2.38 |

Example 2, the N-methyl pyridinium hydroxide composition of the present invention, desirably exhibits the lowest $pK_b$ value, i.e., the highest basicity of the five developers listed.

The developing compositions are tested on resist coatings prepared by applying two spray coats of hexamethyldisilane to a silicon wafer, followed by application of a resist layer using HUNT WAYCOAT 204 Photoresist and standard wafer-coating equipment. The resist layer is subsequently prebaked at standard temperature and imagewise exposed with a Perkin Elmer Scanning UV machine having a UV source of about 1000 watts.

Developing is performed by placing the exposed resist coated slice in a container of developing composition and agitating for 20 seconds, except for Examples E, F and G which are left in developing composition for 5 minutes. The developed slices are then removed from the developing composition and rinsed in a beaker of deionized water for 2 seconds to stop development, followed by a 15 second rinse under deionized water to completely clean the slice of developer.

Microscopic examination of the developed wafers revealed superior line definition and selectivity for exposed versus unexposed photoresist when employing the composition of Example 2, relative to the compositions of Examples A, B and C.

The developing composition of Example 2 is comparable to the commercially available developing composition of Comparative Example D. Comparative Examples A, B, and C do not provide acceptable development even when the development time is extended to 5 minutes in Comparative Examples E, F and G.

Although the above discussion has been directed primarily to a method using the compositions as photoresist developers, the compositions can also be used in other applications, such as RTV (Room Temperature Vulcanizing) Strippers and etchants.

While the invention has been described in terms of various preferred embodiments, one skilled in the art will appreciate that various modifications, substitutions, omissions, and changes may be made without departing from the spirit thereof. Accordingly, it is intended that the scope of the present invention be limited solely by the scope of the following claims.

What is claimed is:

1. A method of developing a positive photoresist layer of the novalac type which has been image-wise-exposed to radiation comprising contacting the layer with an alkaline developing composition to remove exposed areas of the layer, the developing composition consisting essentially of a solution of a cyclic quaternary ammonium hydroxide developing agent in which a quaternary substituted nitrogen is a member of an aromatic or nonaromatic ring between 4 and 8 atoms, said developing agent being present in a concentration sufficient to act as a developing agent, the solution having a normality of the cyclic quaternary ammonium hydroxide between about 0.1N and about 6.0N.

2. The method of claim 1 wherein the cyclic quaternary ammonium hydroxide is a derivative of pyridine, purine, pyrrole, carbazole, an isopyrrole, diazepine, pyrazole, azepine, triazole, indole, oxazole, indolemine, isoxazole, isobenzazole, thiazole, pyrindine, an isothiazole, pyranol-pyrrole, an oxadiazole, isoindazole, dioxazole, indoxazine, pyridazine, benzoxazole, pyrimidine, anthranil, pyrazine, quinoline, piperazine, isoquinoline, triazine, cinnoline, oxazine, quinazoline, isoxazine, naphthridine, oxathiazine, pyrido-pyridine, oxadiazine, benzoxazine morpholine, benzisoxazine, acridine, imidazoline, an oxatriazole, or pyrrolidone.

3. The method of claim 1 wherein the quaternary nitrogen of the cyclic quaternary ammonium hydroxide is within an aromatic ring.

4. The method of claim 3 wherein the cyclic quaternary ammonium hydroxide is an N-alkyl substituted pyridinium hydroxide.

5. The method of claim 4 wherein the alkyl group on the quaternary nitrogen is of one of four carbon atoms.

6. The method of claim 4 wherein the cyclic quaternary ammonium hydroxide is N-methyl pyridinium hydroxide.

7. The method of claim 1 wherein the normality of the developing agent within the developing composition is between about 0.2N and about 0.5N.

8. The method of claim 1 wherein the developing composition comprises an aqueous solution of the developing agent.

9. The method of claim 1 wherein the developing composition also includes a surfactant.

* * * * *